(12) United States Patent
Wang et al.

(10) Patent No.: US 12,266,684 B2
(45) Date of Patent: Apr. 1, 2025

(54) HIGH DENSITY CAPACITOR

(71) Applicant: Taiwan Semiconductor Manufacturing Company, Ltd., Hsinchu (TW)

(72) Inventors: Pei-Jen Wang, Nantou County (TW); Ching-Hung Kao, Tainin (TW); Tzy-Kuang Lee, Taichung (TW); Meng-Chang Ho, Taichung (TW); Kun-Mao Wu, Taoyuan (TW)

(73) Assignee: Taiwan Semicondcutor Manufacturing Company, Ltd., Hsinchu (TW)

( * ) Notice: Subject to any disclaimer, the term of this patent is extended or adjusted under 35 U.S.C. 154(b) by 380 days.

(21) Appl. No.: 17/700,380

(22) Filed: Mar. 21, 2022

(65) Prior Publication Data

US 2023/0299124 A1 Sep. 21, 2023

(51) Int. Cl.
*H01L 23/522* (2006.01)
*H01L 49/02* (2006.01)
*H01L 27/06* (2006.01)

(52) U.S. Cl.
CPC .......... *H01L 28/60* (2013.01); *H01L 23/5226* (2013.01); *H01L 27/0629* (2013.01)

(58) Field of Classification Search
CPC .. H01L 28/60; H01L 23/5226; H01L 27/0629

USPC ......................................................... 257/532
See application file for complete search history.

(56) References Cited

U.S. PATENT DOCUMENTS

| 2004/0124454 A1* | 7/2004 | Choi ...................... H01L 28/57 257/295 |
| 2022/0084935 A1 | 3/2022 | Lin et al. |

FOREIGN PATENT DOCUMENTS

TW 202032721 A 9/2020

* cited by examiner

*Primary Examiner* — Tu-Tu V Ho
(74) *Attorney, Agent, or Firm* — Kilpatrick Townsend & Stockton LLP

(57) ABSTRACT

A method of forming a capacitor is disclosed. The method includes forming a portion of a metallization layer on a substrate, forming a via layer on the substrate, and forming a first electrode between the metallization layer and the via layer, where the first electrode is electrically connected to the metallization layer. The method also includes forming a second electrode between the metallization layer and the via layer, where the second electrode is electrically connected to the via layer, and forming a dielectric layer between the first electrode and the second electrode, where the first electrode is not electrically connected to any other conductors other than through the metallization layer, and where the second electrode is not electrically connected to any conductors other than through the via layer.

20 Claims, 10 Drawing Sheets

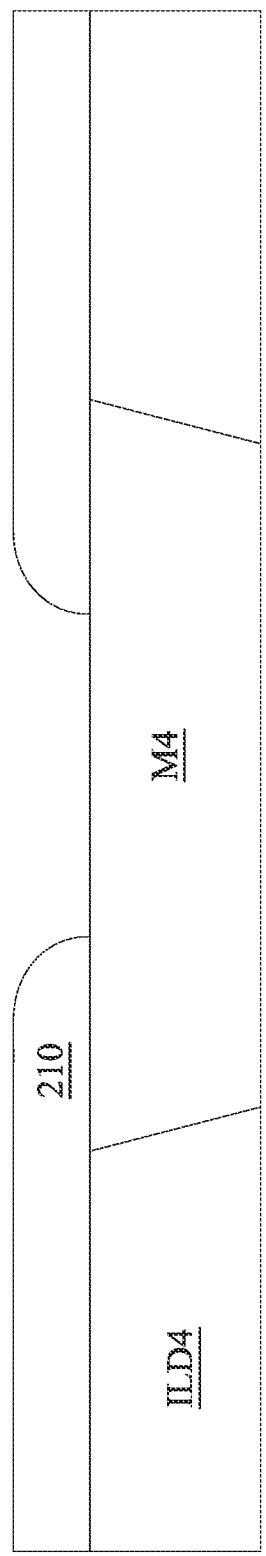

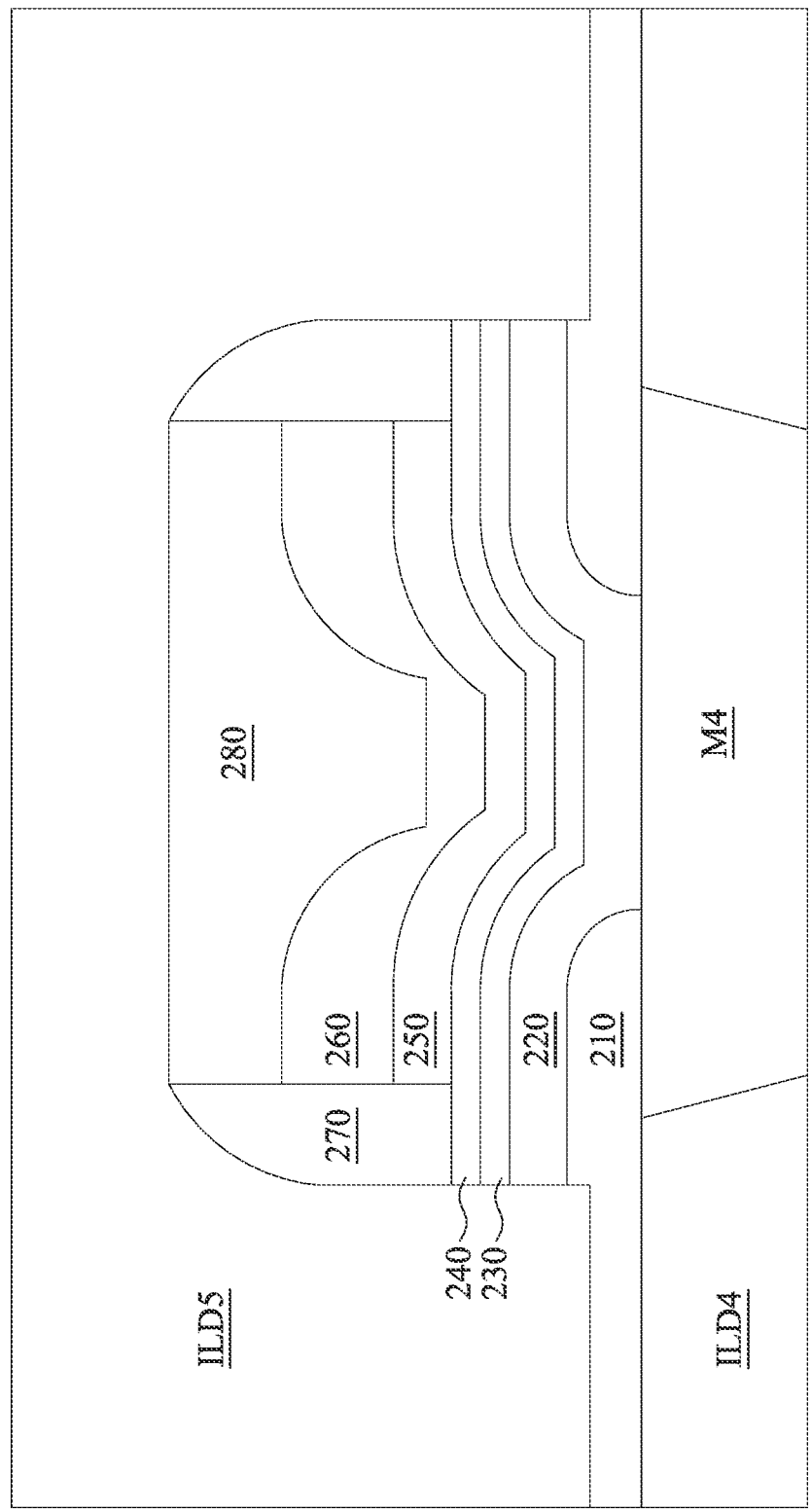

HIGH DENSITY CAPACITOR

TECHNICAL FIELD

The subject matter described herein relates to a metal insulator metal (MIM) capacitor, and more particularly to a high density MIM capacitor.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Metal-insulator-metal (MIM) capacitors are used in many applications on an integrated circuit (IC), including for memory circuits, analog circuits, filter circuits, and decoupling noise suppression circuits.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5F illustrate a method of forming the MIM capacitor of FIG. 2 according to some embodiments.

When practical, similar reference numbers denote similar structures, features, or elements.

DETAILED DESCRIPTION

Figure 1:
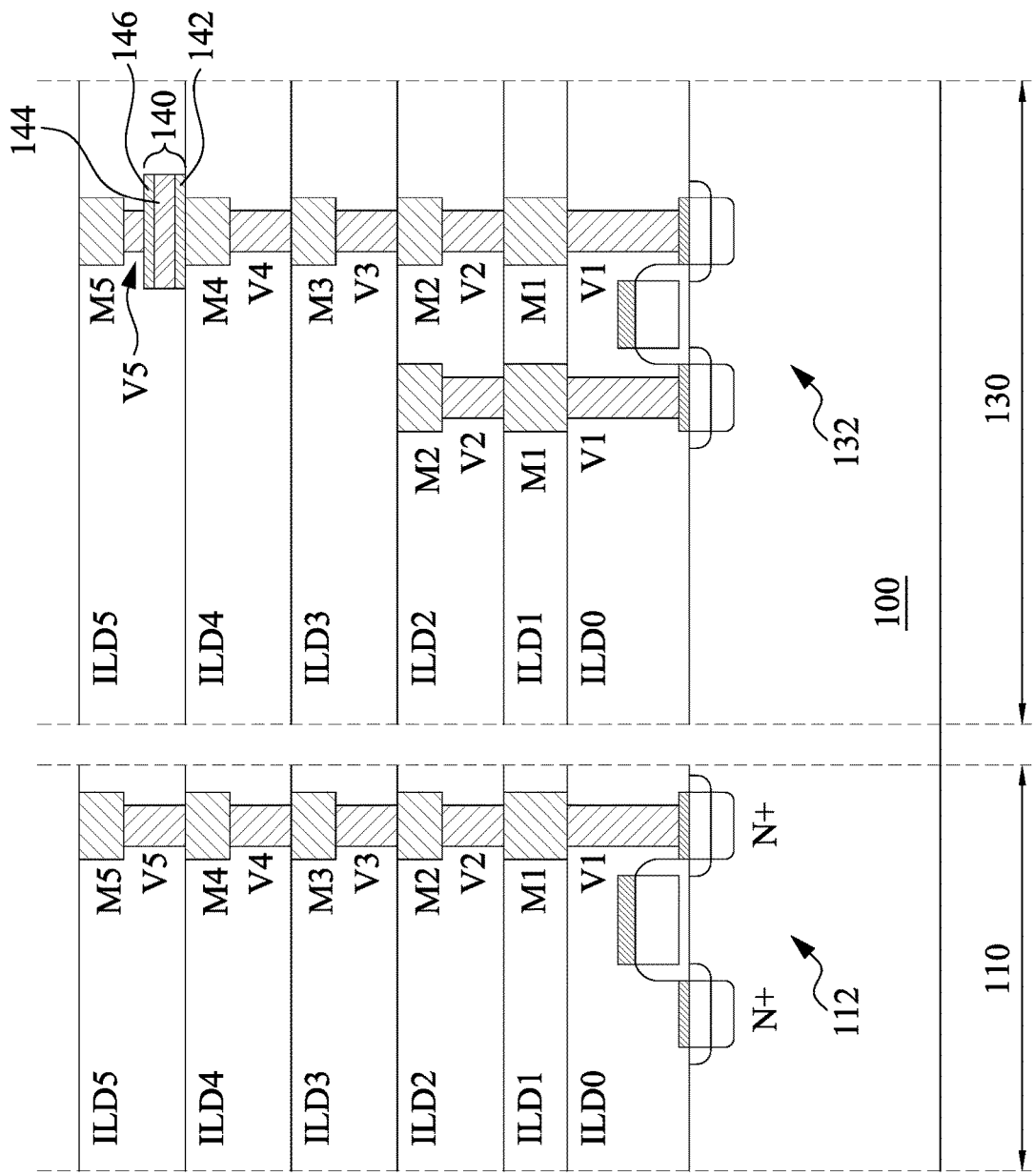
FIG. 1 illustrates a cross-sectional diagram of a semiconductor substrate that includes a transistor and metal-insulator-metal (MIM) capacitor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

The capacitance of a MIM capacitor is related to an overlap area of overlapping portions of a top plate and a bottom plate of the MIM capacitor. For a greater capacitance needed, more overlap area used. In addition to the overlap area, the MIM capacitor also includes an overhead area, which is necessary for the MIM capacitor, but does not contribute to the capacitance of the MIM capacitor. Accordingly, capacitance per area is maximized by minimizing the ratio of the overhead area to the overlap area.

In the embodiments discussed herein MIM capacitor structures are discussed which minimize the ratio of the overhead area to the overlap area.

FIG. 1 illustrates a cross-sectional diagram of a semiconductor substrate 100, which includes a plurality of functional areas fabricated on a single substrate. Substrate 100 includes a first area 110 and a second area 130. First area 110 includes circuitry, such as the exemplary first transistor 112, for processing signals received from or transmitted to, for example, second area 130, another area, or another system or chip. Second area 130 also includes circuitry, such as the exemplary second transistor 132, for processing signals received from or transmitted to, for example, first area 110, another area, or another system or chip. MIM structures 140 may include a bottom electrode 142 and top electrode 146, with a dielectric layer 144 sandwiched in between the top and bottom electrodes 142 and 146.

The substrate may have other areas, transistors, and/or other similar MIM capacitors.

The substrate 100 also includes metallization layers and vias. As depicted, substrate 100 is fabricated using five metallization layers, labeled as M1 through M5, with five layers of metallization vias or interconnects, labeled as V1 through V5. Other embodiments may contain more or fewer metallization layers and a corresponding more or fewer number of vias. First area 110 includes a full metallization stack, including a portion of each of metallization layers M1-M5 connected by interconnects V2-V5, with V1 connecting the stack to a source/drain contact of first transistor 112. In some embodiments, the portions of each of metallization layers M1-M4 extend beyond the interconnects V1-V5 connected thereto by no more than a minimum distance as defined by process design rules.

Second area 130 includes a full metallization stack connecting MIM capacitor 140 to a source/drain contact of second transistor 132. MIM structures 140 are depicted as being fabricated in between the top of the M4 layer and the bottom the M5 layer. Also included in substrate 100 is a plurality of inter-layer dielectric (ILD) layers. Six ILD layers, identified as ILD0 through ILD5 are depicted in FIG. 1 as spanning the first area 110 and the second area 130. The ILD layers may provide electrical insulation as well as structural support for the various features of substrate 100 during many fabrication process steps, some of which will be discussed herein.

The first and second transistors 112 and 132 may be formed simultaneously using processing steps which substantially simultaneously form each of the various portions of the first and second transistors 112 and 132. Similarly, interconnects V1-V5 for the first and second areas 110 and 130 may be simultaneously formed.

In some embodiments, in the first and second areas 110 and 130, the portions of each of metallization layers M1-M4 extend beyond the interconnects V1-V5 connected thereto by less than about 1.01 times, about 1.02 times, about 1.03 times, about 1.04 times, about 1.05 times, about 1.075 times, about 1.1 times, about 1.2 times, about 1.3 times, about 1.4 times, about 1.5 times, about 1.6 times, about 1.75 times, about 2 times, about 2.5 times, about 3 times, about 4 times, or about 5 times a minimum distance as defined by process design rules. In some embodiments, the portions of each of metallization layers M1-M4 is not directly electrically shorted, is not directly electrically connected, and/or is not directly connected to conductors other than those illustrated in FIG. 1.

The MIM capacitor 140 in FIG. 1 is connected from the top at a top electrode 146 and from the bottom at a bottom electrode 142.

MIM capacitor 140 may be fabricated simultaneously with other MIM structures. In some embodiments, after M4 has been patterned and ILD4 has been deposited, substrate 100 undergoes a planarization process, such as chemomechanical planarization (CMP). After the CMP process, a bottom electrode 142 is deposited overlaying ILD4 and the exposed portions of M4. The bottom electrode 142 may comprise any of a variety of materials. For example, bottom electrode 142 may include one or more of Pt, AlCu, TiN, Au, Ti, Ta, TaN, W, WN, and Cu. In some embodiments, other materials may be used. Generally, the bottom electrode materials are conductive materials such as metals, certain metal nitrides, and silicided metal nitrides. The dielectric layers ILD0 through ILD5 are formed from an insulating material, including but not limited to NiO, TiO, HfO, ZrO, ZnO, WO3, Al2O3, TaO, MoO, and CuO. In some embodiments, other materials may be used. The insulating material may be a high dielectric constant (high-k) material, which may include TiO2, Ta2O5, Y2O3, La2O5, HfO2. In some embodiments, other materials may be used. The top electrode 146 may be fabricated from one or more of the same materials and/or the same thickness as bottom electrode 142, as described above. In some embodiments, other materials and/or another thickness may be used. The one or more materials and/or the thickness of the top electrode 146 may be the same as the materials and/or the thickness of bottom electrode 142. In some embodiments, one or more materials and/or the thickness of the top electrode 146 is different from one or more materials and/or the thickness used for the bottom electrode 142.

Figure 2:
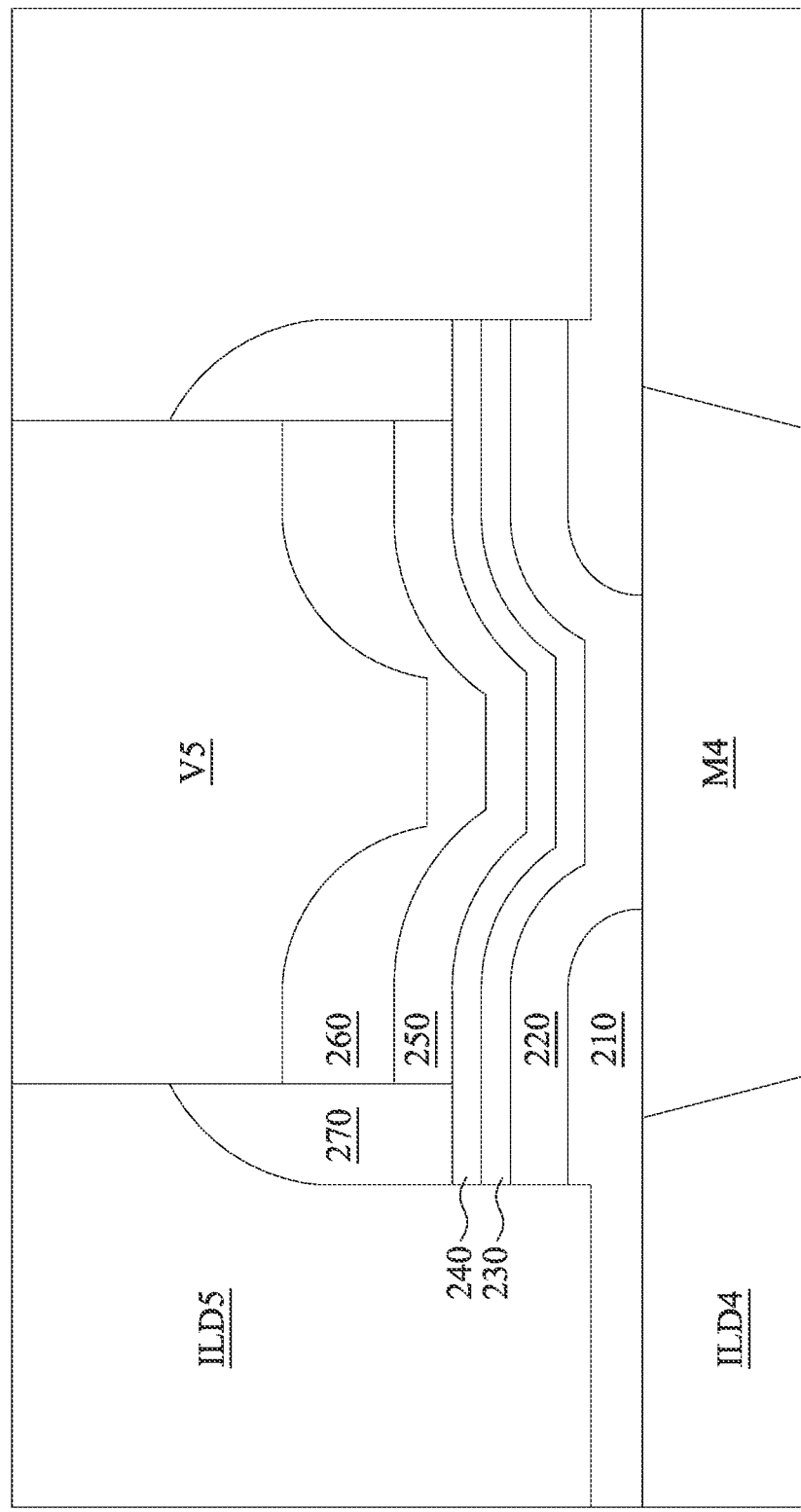
FIG. 2 illustrates a cross-sectional diagram of a metal-insulator-metal (MIM) capacitor according to some embodiments.

FIG. 2 illustrates a cross-sectional diagram of a metal-insulator-metal (MIM) capacitor 200 according to some embodiments. MIM capacitor 200 may be used as MIM capacitor 140 illustrated in FIG. 1. In alternative embodiments, other MIM capacitors or capacitor structures may be used as MIM capacitor 140 of FIG. 1.

MIM capacitor 200 makes an electrical connection to a section of fourth metallization layer M4 in fourth interlayer dielectric ILD4, over which an insulator layer 210, comprising, for example, silicon carbide, or other similar, has been formed. In some embodiments, the insulator layer 210 comprises one or more other materials. The insulator layer 210 may, for example, have a thickness equal to about 10 A, about 25 A, about 50 A, about 75 A, about 100 A, about 200 A, about 300 A, about 400 A, about 500 A, about 600 A, about 700 A, about 800 A, about 900 A, about 1000 A, about 1100 A, about 1200 A, about 1300 A, about 1400 A, or about 1500 A. In some embodiments, the insulator layer 210 has another thickness.

MIM capacitor 200 includes a barrier layer 220 formed over the insulator layer 210, where the barrier layer 220 contacts the fourth metallization layer M4 through a hole in the insulator layer 210, as illustrated. The barrier layer 220 is conductive, and is configured to substantially prevent the metal material of fourth metallization layer M4, such as copper, from diffusing or migrating therethrough. In some embodiments, the barrier layer 220 may, for example, be formed so as to include one or more of Ta, TaN, and TiN. In some embodiments, other materials may be used. The barrier layer 220 may, for example, have a thickness equal to about 10 A, about 25 A, about 50 A, about 75 A, about 100 A, about 200 A, about 300 A, about 400 A, about 500 A, about 600 A, about 700 A, about 800 A, about 900 A, or about 1000 A. In some embodiments, the barrier layer 220 has another thickness.

MIM capacitor 200 also includes a bottom electrode 230 formed over the barrier layer 220, where the bottom electrode 230 mechanically and electrically contacts the barrier layer 220, as illustrated. The bottom electrode 230 is conductive, and, in some embodiments, is substantially coextensive with the barrier layer 220 in a lateral direction, as illustrated. In some embodiments, the bottom electrode 230 may, for example, be formed so as to include one or more of Cu, Ag, Pt, Au, W, Ti, TiN, TaN, Ru, and Mo. In some embodiments, other materials may be used. The bottom electrode 230 may, for example, have a thickness equal to about 10 A, about 25 A, about 50 A, about 75 A, about 100 A, about 200 A, about 300 A, about 400 A, about 500 A, about 600 A, about 700 A, about 800 A, about 900 A, or about 1000 A. In some embodiments, the bottom electrode 230 has another thickness.

The bottom electrode 230 and the barrier layer 220 may collectively be considered a bottom electrode. In some embodiments, a bottom electrode can be considered as including one or more other conductors confined to the peripheral boundary of bottom electrode illustrated in FIG. 3.

MIM capacitor 200 also includes a high dielectric constant layer 240. The HK layer 240 may, for example, have a dielectric constant greater than about 3. In some embodiments, the HK layer provides improved performance because of its bandgap value. For example, the HK layer may have a bandgap between about 5.5 eV and about 6 eV. In some embodiments, the HK layer has a bandgap of about 5.7 eV. In some embodiments, the HK layer has a bandgap of about 6 eV. Other bandgap values may be used. The HK layer 240 is formed over the bottom electrode 230, where the HK layer 240 mechanically contacts the barrier layer 220, as illustrated. The HK layer 240 is insulative, and, in some embodiments, is substantially coextensive with the bottom electrode 230 in a lateral direction, as illustrated. In some embodiments, the HK layer 240 may, for example, be formed so as to include one or more of HfOx, TaOx, TiOx, NiOx, ZnO, $Al_2O_3$. In some embodiments, other materials may be used. The HK layer 240 may, for example, have a thickness equal to about 5 A, about 10 A, about 25 A, about 50 A, about 75 A, about 100 A, about 200 A, about 300 A, about 400 A, or about 500 A. In some embodiments, the HK layer 240 has another thickness.

MIM capacitor 200 also includes a top electrode. The top electrode is formed over the HK layer 240, where the top electrode mechanically contacts the HK layer 240, as illustrated. The top electrode is conductive, and, in some embodiments, is smaller than the barrier layer 220, the bottom electrode 230, and the HK layer 240 in a lateral direction, as illustrated. In some embodiments, the top electrode may, for example, be formed so as to include one or more of Ta, TaN, TiN, Ni, Cu, Au, Ag, Pt. In some embodiments, other materials may be used. The top electrode may, for example, have a thickness equal to about 5 A, about 10 A, about 25 A, about 50 A, about 75 A, about 100 A, about 125 A, about 150 A, about 175 A, about 200 A, about 300 A, about 400 A, about 500 A, about 600 A, about 700 A, about 800 A, about 900 A, or about 1000 A. In some embodiments, the top electrode has another thickness.

In some embodiments, the top electrode includes one or more additional layers. In some embodiments, one or more of the top electrode layers may be fabricated from one or more of the same materials as one or more others of the top electrode layers. In some embodiments, one or more materials of one or more of the top electrode layers may be fabricated from one or more materials not used in one or more others of the top electrode layers. In some embodiments, one or more of the top electrode layers are coextensive in a lateral direction as one or more others of the top electrode layers.

Figure 3:
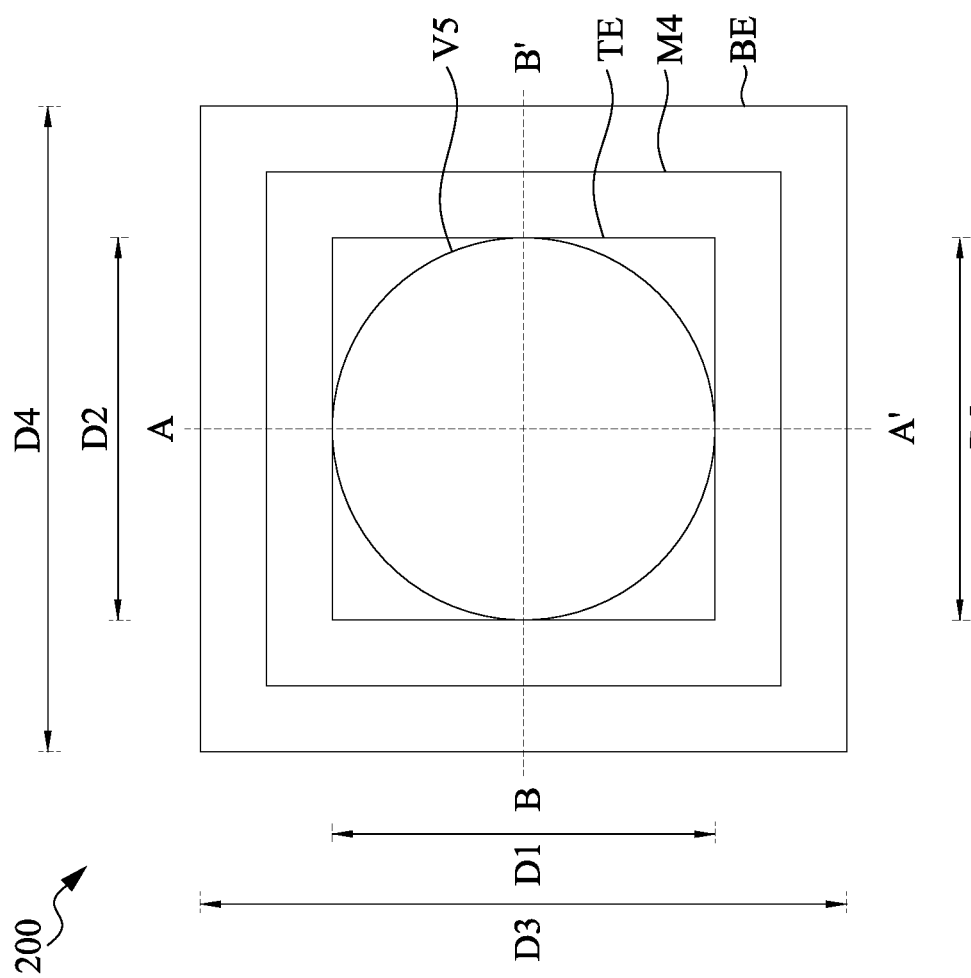
FIG. 3 illustrates a plan view diagram of the MIM capacitor of FIG. 2 according to some embodiments.

In some embodiments, a top electrode can be considered as including one or more other conductors confined to the peripheral boundary of top electrode illustrated in FIG. 3.

As illustrated the top electrode is surrounded by a side insulating layer 270, which may, for example, comprise a high dielectric material, such as SiN.

The top electrode of MIM capacitor 200 makes a mechanical and electrical connection to a via formed in the fifth via layer V5.

FIG. 3 illustrates a plan view diagram of the MIM capacitor 200 of FIG. 2 according to some embodiments. The plan view diagram of FIG. 3 illustrates geometries representing peripheral boundaries of the bottom electrode BE, the top electrode TE, and the via formed in the fifth via layer V5.

In the illustrated embodiment, the cross-sectional view illustrated in FIG. 2 could correspond with a cross-section of the MIM capacitor 200 in a plane perpendicular to the illustrated plane of the plan view of FIG. 3 and including the line segment A-A'. Similarly, in the illustrated embodiment, the cross-sectional view illustrated in FIG. 2 could correspond with a cross-section of the MIM capacitor 200 in a plane perpendicular to the illustrated plane of the plan view of FIG. 3 and including the line segment the B-B'.

As illustrated in FIG. 2, in this embodiment, the peripheral boundary of the bottom electrode BE in FIG. 3 also represents peripheral boundaries of the barrier layer 220 and the HK layer 240. Similarly, as illustrated in FIG. 2, in this embodiment, the peripheral boundary of the top electrode TE in FIG. 3 represents the peripheral boundary of all of the top electrode layers.

The illustrated diameter of the via is equal to the dimension D5, as illustrated in FIG. 3. The peripheral boundary of the top electrode TE is represented as a rectangle having first and second side dimensions D1 and D2. In addition, the peripheral boundary of the bottom electrode BE is represented as a rectangle having third and fourth side dimensions D3 and D4.

In some embodiments, first and second side dimensions D1 and D2 are not equal. In some embodiments, first and second side dimensions D1 and D2 are substantially equal, such that the peripheral boundary of the top electrode TE substantially forms a square. In some embodiments, third and fourth side dimensions D3 and D4 are not equal. In some embodiments, third and fourth side dimensions D3 and D4 are substantially equal, such that the peripheral boundary of the bottom electrode BE substantially forms a square.

In the embodiment illustrated in FIG. 3, the peripheral boundary of the bottom electrode BE and the peripheral boundary of the top electrode TE share a common center point. In some embodiments, the peripheral boundary of the bottom electrode BE and the peripheral boundary of the top electrode TE do not share a common center point.

In the embodiment illustrated in FIG. 3, third side dimension D3 is greater than first side dimension D1. Accordingly, in the embodiment illustrated in FIG. 3, the peripheral boundary of the bottom electrode BE extends beyond the peripheral boundary of the top electrode TE in the illustrated vertical direction. In the embodiment illustrated in FIG. 3, fourth side dimension D4 is greater than second side dimension D2. Accordingly, in the embodiment illustrated in FIG. 3, the peripheral boundary of the bottom electrode BE extends beyond the peripheral boundary of the top electrode TE in the illustrated horizontal direction. Accordingly, in the embodiment illustrated in FIG. 3, the peripheral boundary of the bottom electrode BE extends beyond the peripheral boundary of the top electrode TE in all directions. In some embodiments, the peripheral boundary of the bottom electrode BE extends beyond the peripheral boundary of the top electrode TE by no more than a minimum distance as defined by process design rules.

In addition, in the illustrated embodiment, the peripheral boundary of the top electrode TE extends beyond the peripheral boundary of the via in all directions. In some embodiments, the peripheral boundary of the top electrode TE extends beyond the peripheral boundary no more than a minimum distance as defined by a process design rules.

In some embodiments, the via is formed with a diameter dimension D5 equal to about 3 nm, about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, or about 100 nm.

In some embodiments, the first dimension D1 is equal to about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or greater.

In some embodiments, the first dimension D1 is greater than the fifth dimension D5 by about 3 nm, about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or more.

In some embodiments, the first dimension D1 is greater than the fifth dimension D5 by a factor, where the factor is equal to about 1.01, about 1.02, about 1.03, about 1.04, about 1.05, about 1.06, about 1.08, about 1.1, about 1.2, about 1.3, about 1.4, about 1.5, about 1.6, about 1.8, about 2, about 2.5, about 3, about 4, about 5, about 6, about 8, about 10, about 15, about 20, about 25, about 30, about 50, about 75, about 100, or more.

In some embodiments, the second dimension D2 is equal to about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or greater.

In some embodiments, the second dimension D2 is greater than the fifth dimension D5 by about 3 nm, about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or more.

In some embodiments, the second dimension D2 is greater than the fifth dimension D5 by a factor, where the factor is equal to about 1.01, about 1.02, about 1.03, about 1.04, about 1.05, about 1.06, about 1.08, about 1.1, about 1.2, about 1.3, about 1.4, about 1.5, about 1.6, about 1.8, about 2, about 2.5, about 3, about 4, about 5, about 6, about 8, about 10, about 15, about 20, about 25, about 30, about 50, about 75, about 100, or more.

In some embodiments, the second dimension D2 is greater than the first dimension D1 by about 1 nm, about 3 nm, about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or more.

In some embodiments, the second dimension D2 is greater than the first dimension D1 by a factor, where the factor is equal to about 1.01, about 1.02, about 1.03, about 1.04, about 1.05, about 1.06, about 1.08, about 1.1, about 1.2, about 1.3, about 1.4, about 1.5, about 1.6, about 1.8, about 2, about 2.5, about 3, about 4, about 5, about 6, about 8, about 10, about 15, about 20, about 25, about 30, about 50, about 75, about 100, or more.

In some embodiments, the third dimension D3 is equal to about 6 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or greater.

In some embodiments, the third dimension D3 is greater than the fifth dimension D5 by about 4 nm, about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or more.

In some embodiments, the third dimension D3 is greater than the fifth dimension D5 by a factor, where the factor is equal to about 1.02, about 1.03, about 1.04, about 1.05, about 1.06, about 1.08, about 1.1, about 1.2, about 1.3, about 1.4, about 1.5, about 1.6, about 1.8, about 2, about 2.5, about 3, about 4, about 5, about 6, about 8, about 10, about 15, about 20, about 25, about 30, about 50, about 75, about 100, or more.

In some embodiments, the third dimension D3 is greater than the first dimension D1 by less than about 2 nm, about 3 nm, about 4 nm, about 5 nm, about 7 nm, about 10 nm, about 15 nm, about 20 nm, about 25 nm, about 30 nm, about 35 nm, or about 40 nm.

In some embodiments, the third dimension D3 is greater than the first dimension D1 by a factor, where the factor is less than about 1.01, about 1.02, about 1.03, about 1.04, about 1.05, about 1.06, about 1.08, about 1.1, about 1.2, about 1.3, about 1.4, or about 1.5.

To maximize capacitance per area used the third dimension D3 may be greater than the first dimension D1 by an amount as small as possible.

In some embodiments, the fourth dimension D4 is equal to about 6 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or greater.

In some embodiments, the fourth dimension D4 is greater than the fifth dimension D5 by about 4 nm, about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or more.

In some embodiments, the fourth dimension D4 is greater than the fifth dimension D5 by a factor, where the factor is equal to about 1.02, about 1.03, about 1.04, about 1.05, about 1.06, about 1.08, about 1.1, about 1.2, about 1.3, about 1.4, about 1.5, about 1.6, about 1.8, about 2, about 2.5, about 3, about 4, about 5, about 6, about 8, about 10, about 15, about 20, about 25, about 30, about 50, about 75, about 100, or more.

In some embodiments, the fourth dimension D4 is greater than the second dimension D2 by less than about 2 nm, about 3 nm, about 4 nm, about 5 nm, about 7 nm, about 10 nm, about 15 nm, about 20 nm, about 25 nm, about 30 nm, about 35 nm, or about 40 nm.

In some embodiments, the fourth dimension D4 is greater than the second dimension D2 by a factor, where the factor is less than about 1.01, about 1.02, about 1.03, about 1.04, about 1.05, about 1.06, about 1.08, about 1.1, about 1.2, about 1.3, about 1.4, or about 1.5.

To maximize capacitance per area used the fourth dimension D4 may be greater than the second dimension D2 by an amount as small as possible.

In some embodiments, the fourth dimension D4 is greater than the third dimension D3 by about 1 nm, about 3 nm, about 5 nm, about 7 nm, about 10 nm, about 15 nm, about 20 nm, about 25 nm, about 30 nm, about 35 nm, about 40 nm, about 50 nm, about 60 nm, about 70 nm, about 80 nm, about 90 nm, about 100 nm, about 110 nm, about 120 nm, about 130 nm, about 140 nm, about 150 nm, about 175 nm, about 200 nm, or more.

In some embodiments, the fourth dimension D4 is greater than the third dimension D3 by a factor, where the factor is equal to about 1.01, about 1.02, about 1.03, about 1.04, about 1.05, about 1.06, about 1.08, about 1.1, about 1.2, about 1.3, about 1.4, about 1.5, about 1.6, about 1.8, about 2, about 2.5, about 3, about 4, about 5, about 6, about 8, about 10, about 15, about 20, about 25, about 30, about 50, about 75, about 100, or more.

As illustrated in FIGS. 2 and 3, the bottom electrode is not directly electrically shorted, is not directly electrically connected, and/or is not directly connected to any conductors outside of the lateral area defined by the peripheral boundary of the bottom electrode. In some embodiments, the layer forming the bottom electrode is not directly electrically shorted, is not directly electrically connected, and/or is not directly connected to any conductors in a plane represented by the bottom electrode illustrated in FIG. 3. In some embodiments, the bottom electrode is not electrically shorted to any portions of a metallization layer other than through the metallization layer to which the bottom electrode is directly contacted. In some embodiments, the bottom electrode is not electrically connected to any other electrical components other than through the metallization layer to which the bottom electrode is directly contacted.

In some embodiments, a peripheral boundary of the fourth metallization layer M4 does not extend beyond the peripheral boundary of the bottom electrode.

As illustrated in FIGS. 2 and 3, the top electrode is not directly electrically shorted, is not directly electrically connected, and/or is not directly connected to any conductors outside of the lateral area defined by the peripheral boundary of the top electrode. In some embodiments, the layer or layers forming the top electrode are not directly electrically shorted, are not directly electrically connected, and/or are not directly connected to any conductors in a plane represented by the top electrode illustrated in FIG. 3. In some embodiments, the top electrode is not electrically shorted to any portions of a metallization layer other than through the via layer V5 to which the top electrode is directly contacted. In some embodiments, the top electrode is not electrically connected to any other electrical components other than through the via layer to which the top electrode is directly contacted.

Figure 4:
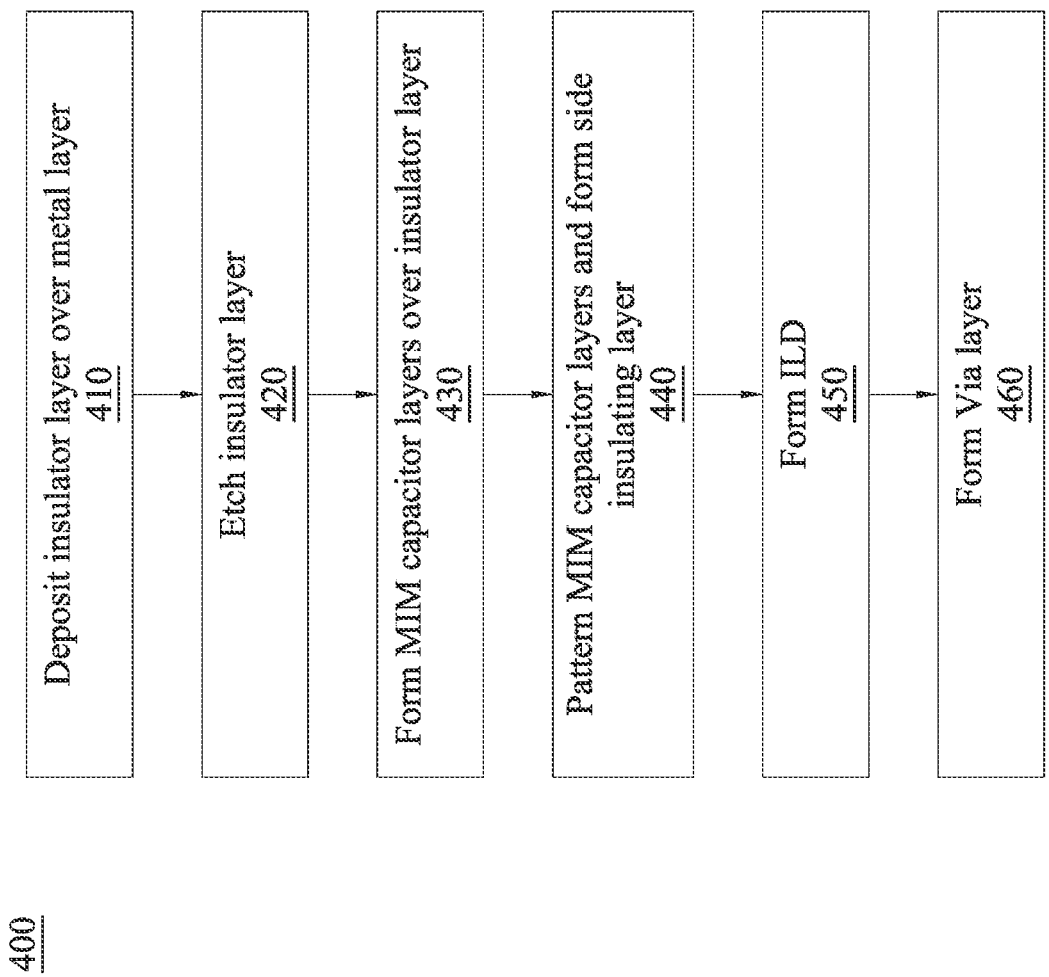
FIG. 4 illustrates a flowchart diagram of a method of forming the MIM capacitor of FIG. 2 according to some embodiments.

FIG. 4 illustrates a flowchart diagram of a method 400 of forming the MIM capacitor of FIG. 2 according to some embodiments. In some embodiments, other methods are used.

Figure 5A:
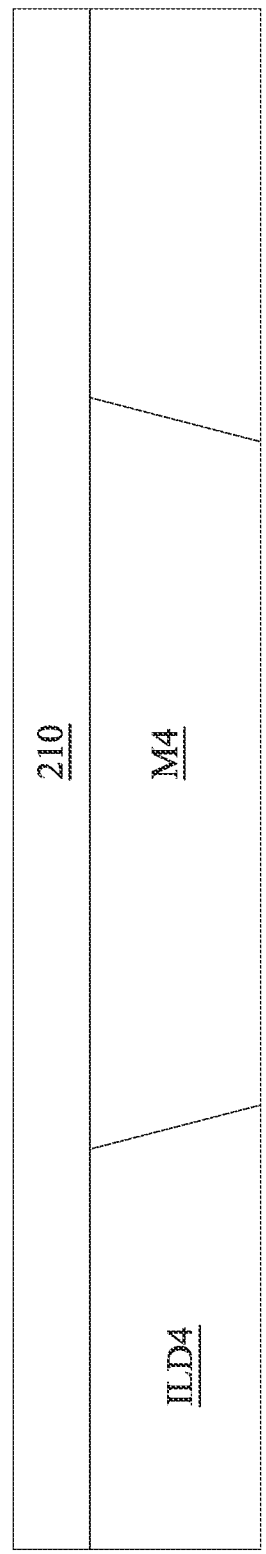

At 410, an insulator layer 210 is deposited on the fourth dielectric layer ILD4 and the fourth metallization layer M4, as shown in FIG. 5A. In some embodiments, insulator layer 210 comprises, for example, silicon carbide. In some embodiments, the insulator layer 210 comprises one or more other materials. The insulator layer 210 may, for example, have a thickness equal to about 5 A, about 10 A, about 25 A, about 50 A, about 75 A, about 100 A, about 150 A, about 200 A, about 250 A, about 300 A, about 400 A, about 500 A, about 600 A, about 700 A, about 800 A, about 900 A, about 1000 A, about 1100 A, about 1200 A, about 1300 A, about 1400 A, or about 1500 A. In some embodiments, the insulator layer 210 has another thickness.

At 420, the insulator layer 210 is etched, as shown in FIG. 5B. The insulator layer 210 is etched such that the hole is formed in the insulator layer 210, where the hole is aligned with a section of the fourth metallization layer M4, over which the MIM capacitor 200 is to be formed. The etching of the insulator layer 210 may include a plasma-induced etching process, or another etching process known to those of skill in the art.

Figure 5C:
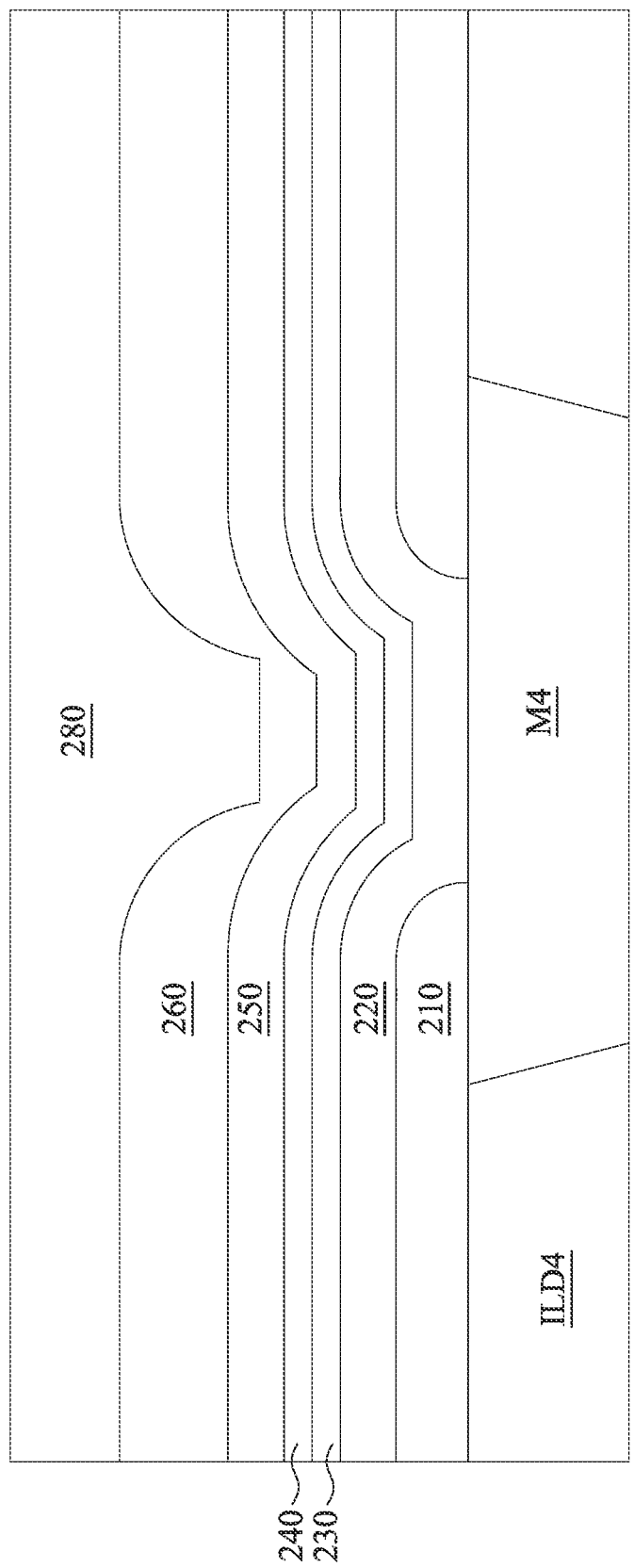

At 430, layers forming the MIM capacitor 200 are formed, as shown in FIG. 5C.

A barrier layer 220 is formed over the insulator layer 210, such that the barrier layer 220 contacts the fourth metallization layer M4 through the hole etched in the insulator layer 210 at 420. The barrier layer 220 is conductive, and is configured to substantially prevent the metal material of fourth metallization layer M4, such as copper, from diffusing or migrating therethrough. In some embodiments, the barrier layer 220 may, for example, be formed so as to include one or more of Ta, TaN, and TiN. In some embodiments, other materials may be used. The barrier layer 220 may, for example, have a thickness equal to about 10 A, about 25 A, about 50 A, about 75 A, about 100 A, about 200 A, about 300 A, about 400 A, about 500 A, about 600 A, about 700 A, about 800 A, about 900 A, or about 1000 A. In some embodiments, the barrier layer 220 has another thickness. In some embodiments, the barrier layer 220 is formed by one or more of chemical vapor deposition (CVD), a variety of suitable processes including CVD, low pressure CVD (LPCVD), plasma-enhanced CVD (PECVD), and atomic layer deposition (ALD). In some embodiments, other suitable processes may be used to form the barrier layer 220.

A bottom electrode 230 is formed over the barrier layer 220, where the bottom electrode 230 mechanically and electrically contacts the barrier layer 220, as illustrated in FIG. 5C. The bottom electrode 230 is conductive, and may, for example, be formed so as to include one or more of Cu, Ag, Pt, Au, W, Ti, TiN, TaN, Ru, and Mo. In some embodiments, other materials may be used. The bottom electrode 230 may, for example, have a thickness equal to about 10 A, about 25 A, about 50 A, about 75 A, about 100 A, about 200 A, about 300 A, about 400 A, about 500 A, about 600 A, about 700 A, about 800 A, about 900 A, or about 1000 A. In some embodiments, the bottom electrode 230 has another thickness. In some embodiments, the bottom electrode 230 is formed by one or more of chemical vapor deposition (CVD), a variety of suitable processes including CVD, low pressure CVD (LPCVD), plasma-enhanced CVD (PECVD), and atomic layer deposition (ALD). In some embodiments, other suitable processes may be used to form the bottom electrode 230.

A high dielectric constant layer 240 is formed. The HK layer 240 may, for example, have a dielectric constant greater than about 3. The HK layer 240 is formed over the bottom electrode 230, such that the HK layer 240 mechanically contacts the barrier layer 220, as illustrated in FIG. 5C. The HK layer 240 is insulative, and may, for example, be formed so as to include one or more of HfOx, TaOx, TiOx, NiOx, ZnO, $Al_2O_3$. In some embodiments, other materials may be used. The HK layer 240 may, for example, have a thickness equal to about 10 A, about 25 A, about 50 A, about 75 A, about 100 A, about 200 A, about 300 A, about 400 A, or about 500 A. A variety of suitable processes including chemical vapor depositions (CVD), low pressure CVD (LPCVD), plasma-enhanced CVD (PECVD), and atomic layer deposition (ALD) may be used to form the HK layer 240. In some embodiments, other suitable processes may be used to form the high dielectric constant layer 240.

A top electrode is formed. In the illustrated embodiment, the top electrode comprises first and second top electrode layers 250 and 260. The first and second top electrode layers 250 and 260 are formed over the HK layer 240, where the first top electrode layer 250 mechanically contacts the HK layer 240, and the second top electrode layer 260 electrically and mechanically contacts the first top electrode layer 250, as illustrated in FIG. 5C. The first and second top electrode layers 250 and 260 are conductive, and may, for example, be formed so as to include one or more of Ta, TaN, TiN, Ni, Cu, Au, Ag, Pt. In some embodiments, other materials may be used. The first and second top electrode layers 250 and 260 may, for example, have a combined thickness equal to about 10 A, about 25 A, about 50 A, about 75 A, about 100 A, about 200 A, about 300 A, about 400 A, about 500 A, about 600 A, about 700 A, about 800 A, about 900 A, or about 1000 A. In some embodiments, the first and second top electrode layers 250 and 260 have another combined thickness. A variety of suitable processes including chemical vapor depositions (CVD), low pressure CVD (LPCVD), plasma-enhanced CVD (PECVD), and atomic layer deposition (ALD) may be used to form the first and second top electrode layers 250 and 260. In some embodiments, other suitable processes may be used to form the first and second top electrode layers 250 and 260.

In some embodiments, the top electrode includes one or more additional layers. In some embodiments, one or more of the top electrode layers may be fabricated from one or more of the same materials as one or more others of the top electrode layers. In some embodiments, one or more materials of one or more of the top electrode layers may be fabricated from one or more materials not used in one or more others of the top electrode layers. In some embodiments, one or more of the top electrode layers are coextensive in a lateral direction as one or more others of the top electrode layers.

A sacrificial layer 280 is deposited on the top electrode, as shown in FIG. 5C. In some embodiments, sacrificial layer 280 comprises, for example, SiON. In some embodiments, the sacrificial layer 280 comprises one or more other materials. The sacrificial layer 280 may, for example, have a thickness equal to about 100 A, about 200 A, about 300 A, about 400 A, about 500 A, about 600 A, about 700 A, about 800 A, about 900 A, about 1000 A, about 1100 A, about 1200 A, about 1300 A, about 1400 A, or about 1500 A. In some embodiments, the sacrificial layer 280 has another thickness. In some embodiments, the sacrificial layer 280 is formed by one or more of chemical vapor deposition (CVD), a variety of suitable processes including CVD, low pressure CVD (LPCVD), plasma-enhanced CVD (PECVD), and atomic layer deposition (ALD). In some embodiments, other suitable processes may be used to form the sacrificial layer 280.

At 440, layers forming the MIM capacitor 200 formed at 430 are patterned.

Figure 5D:
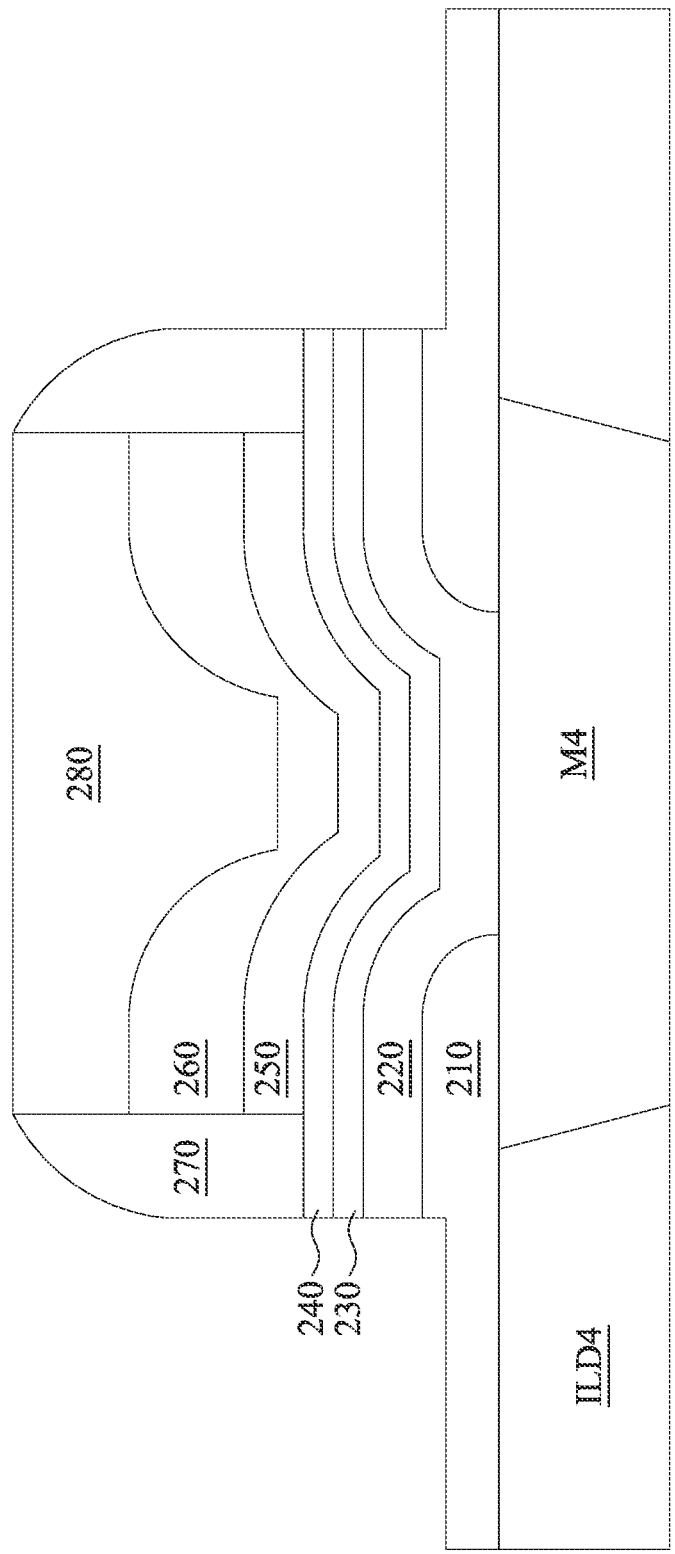

Insulator layer 210, barrier layer 220, bottom electrode 230, high dielectric constant layer 240, first and second top electrode layers 250 and 260, and sacrificial layer 280 are patterned, as illustrated in FIG. 5D. The material of these patterned layers may be patterned using one or more photolithography processes, maskless lithography processes, or a variety of other processes suitable for transferring a pattern to the layers formed at 430. The patterning of each layer may be done using any number of combinations of material removal processes or it may be accomplished by a single material removal process.

Insulator layer 210, barrier layer 220, bottom electrode 230, and high dielectric constant layer 240 are patterned so as to be coextensive, and so that each of the insulator layer 210, barrier layer 220, bottom electrode 230, and high dielectric constant layer 240 has a plan view outer peripheral boundary such as that discussed with reference to the bottom electrode of FIGS. 2 and 3. In some embodiments, one or more or all of insulator layer 210, barrier layer 220, bottom electrode 230, and high dielectric constant layer 240 are patterned with the same photolithographic processing mask.

First and second top electrode layers 250 and 260, and sacrificial layer 280 are patterned so as to be coextensive, and so that each of the first and second top electrode layers 250 and 260, and sacrificial layer 280 has a plan view outer peripheral boundary such as that discussed with reference to the top electrode of FIGS. 2 and 3. In some embodiments, one or more or all of first and second top electrode layers 250 and 260, and sacrificial layer 280 are patterned with the same photolithographic processing mask.

In addition, at 440, a side insulating layer 270 is formed around the top electrode, as shown in FIG. 5D.

Side insulating layer 270 may be deposited and patterned such that remaining portions of the side insulating layer 270 are over the insulator layer 210, barrier layer 220, bottom electrode 230, and the high dielectric constant layer 240, and such that the remaining portions of the side insulating layer 270 surround the first and second top electrode layers 250 and 260, and sacrificial layer 280, as illustrated in FIG. 5D.

A variety of suitable processes including chemical vapor depositions (CVD), low pressure CVD (LPCVD), plasma-enhanced CVD (PECVD), and atomic layer deposition (ALD) may be used to form the first and second top electrode layers 250 and 260. In some embodiments, other suitable processes may be used to deposit the side insulating layer 270.

Side insulating layer 270 may be patterned using one or more photolithography processes, maskless lithography processes, or a variety of other processes suitable for transferring a pattern to side insulating layer 270. In some embodiments, side insulating layer 270 is patterned with the same photolithographic processing mask used for patterning one or more or all of insulator layer 210, barrier layer 220, bottom electrode 230, and high dielectric constant layer 240. In some embodiments, side insulating layer 270 is patterned with the same photolithographic processing mask used for patterning one or more or all of first and second top electrode layers 250 and 260, and sacrificial layer 280.

In some embodiments, the side insulating layer 270, or the side insulating layer 270 and the sacrificial layer 280 are planarized with a planarization process, such as chemomechanical planarization (CMP).

At 450, fifth interlayer dielectric ILD5 is formed over and around the layers formed and patterned at 440, as shown in FIG. 5E. In some embodiments, the fifth interlayer dielectric ILD5 is formed by one or more of chemical vapor deposition (CVD), a variety of suitable processes including CVD, low pressure CVD (LPCVD), plasma-enhanced CVD (PECVD), and atomic layer deposition (ALD). In some embodiments, other suitable processes may be used to form the fifth interlayer dielectric ILD5.

Figure 5F:
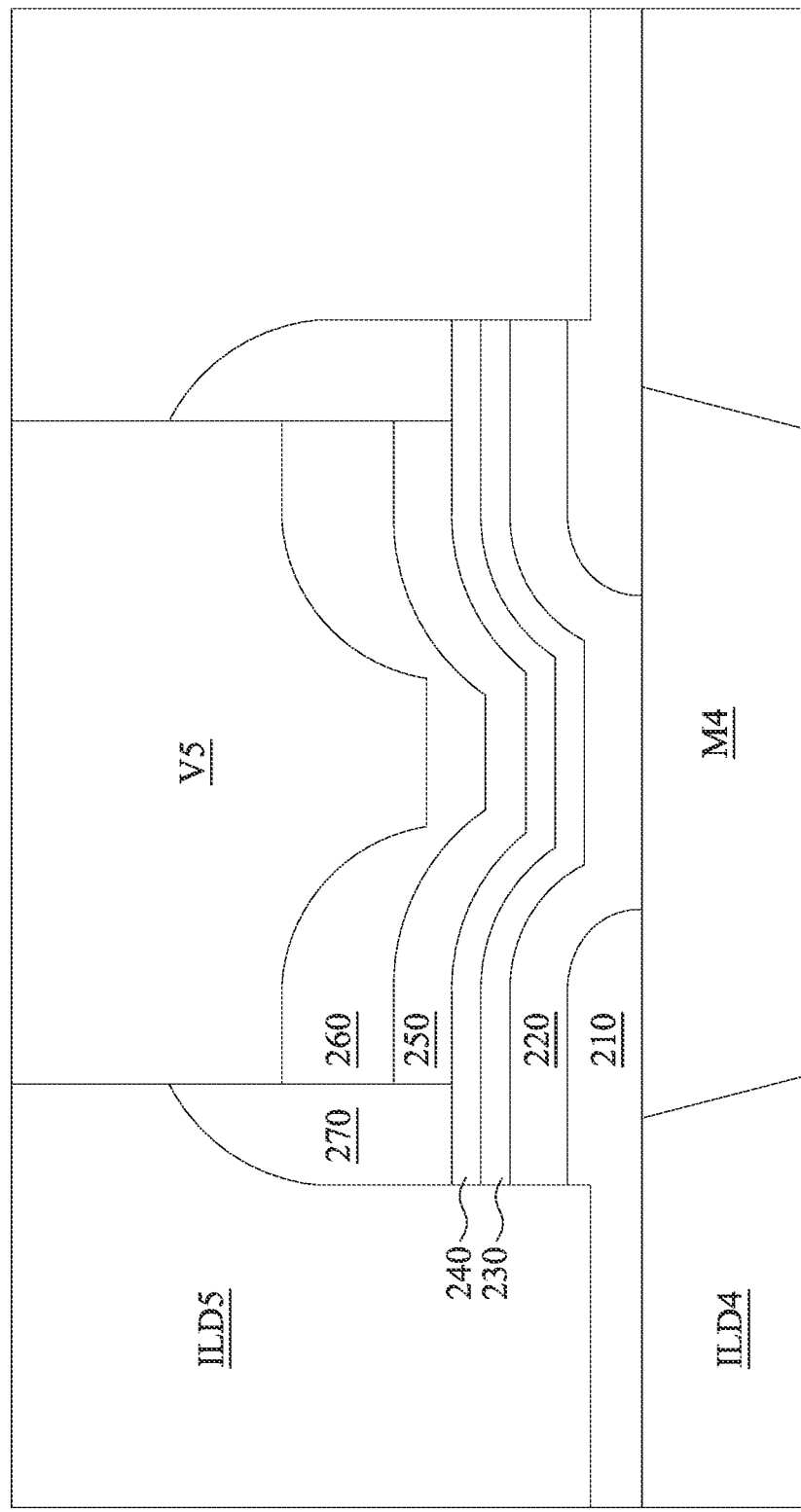

At 460, a via is formed in the fifth via layer V5, as shown in FIG. 5F. To form the via, fifth interlayer dielectric ILD5 is etched to form a via hole, for example, using one or more plasma-induced etching processes. Other etching processes may be used. In addition, sacrificial layer 280 is removed to extend the via hole to the second top electrode layer 260, for example, using one or more wet etch processes, or another etching process. In some embodiments, the fifth interlayer dielectric ILD5 and the sacrificial layer 280 are both etched during an etching process. Furthermore, the via hole is filled with a suitable conductive material comprising, for example, one or more of copper and aluminum.

The fifth interlayer dielectric ILD5 and the fifth via layer V5 may subsequently be planarized using, for example, a CMP planarization process.

As discussed in further detail above, a MIM capacitor having high area efficiency or capacitance/area density may be formed may limiting the area of the bottom electrode which does not contribute to the capacitance of the MIM capacitor.

One inventive aspect is a method of forming a capacitor. The method includes forming a portion of a metallization layer on a substrate, forming a via layer on the substrate, and forming a first electrode between the metallization layer and the via layer, where the first electrode is electrically connected to the metallization layer. The method also includes forming a second electrode between the metallization layer and the via layer, where the second electrode is electrically connected to the via layer, and forming a dielectric layer between the first electrode and the second electrode, where the first electrode is not electrically connected to any other conductors other than through the metallization layer, and where the second electrode is not electrically connected to any conductors other than through the via layer.

In some embodiments, a peripheral boundary of the first electrode encompasses a peripheral boundary of the portion of the metallization layer.

In some embodiments, a peripheral boundary of the first electrode encompasses a peripheral boundary of the second electrode.

In some embodiments, the dielectric layer and the first electrode are coextensive to a peripheral boundary of the first electrode.

In some embodiments, the first electrode includes first and second bottom electrode layers.

In some embodiments, the first and second bottom electrode layers are coextensive to a peripheral boundary of the first electrode.

In some embodiments, the second electrode includes first and second top electrode layers.

In some embodiments, the first and second top electrode layers are coextensive to a peripheral boundary of the second electrode.

Another inventive aspect is a method of forming a capacitor. The method includes forming a portion of a metallization layer on a substrate, forming a via layer on the substrate, and forming a first electrode between the metallization layer and the via layer, where the first electrode is electrically connected to the metallization layer. The method also includes forming a second electrode between the metallization layer and the via layer, where the second electrode is electrically connected to the via layer, and forming a dielectric layer between the first electrode and the second electrode, where the first electrode is not electrically connected to any other electrical components other than through the portion of the metallization layer, and where the second electrode is not electrically connected to any other electrical components other than through the via layer.

In some embodiments, a peripheral boundary of the first electrode encompasses a peripheral boundary of the portion of the metallization layer.

In some embodiments, a peripheral boundary of the first electrode encompasses a peripheral boundary of the second electrode.

In some embodiments, the dielectric layer and the first electrode are coextensive to a peripheral boundary of the first electrode.

In some embodiments, the first electrode includes first and second bottom electrode layers.

In some embodiments, the first and second bottom electrode layers are coextensive to a peripheral boundary of the first electrode.

In some embodiments, the second electrode includes first and second top electrode layers.

In some embodiments, the first and second top electrode layers are coextensive to a peripheral boundary of the second electrode.

Another inventive aspect is a capacitor, including a semiconductor substrate, a portion of a metallization layer formed on the semiconductor substrate, a via layer formed on the semiconductor substrate, and a first electrode between the metallization layer and the via layer, where the first electrode is electrically connected to the metallization layer. The capacitor also includes a second electrode between the metallization layer and the via layer, where the second electrode is electrically connected to the via layer, and a dielectric layer between the first electrode and the second electrode, where the first electrode includes first and second bottom electrode layers, where the first and second bottom electrode layers are coextensive to a peripheral boundary of the first electrode, and where the second electrode includes first and second top electrode layers, where the first and second top electrode layers are coextensive to a peripheral boundary of the second electrode.

In some embodiments, a peripheral boundary of the first electrode encompasses a peripheral boundary of the portion of the metallization layer.

In some embodiments, a peripheral boundary of the first electrode encompasses a peripheral boundary of the second electrode.

In some embodiments, the dielectric layer and the first electrode are coextensive to a peripheral boundary of the first electrode.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a portion of a metallization layer on a substrate;
forming a via layer on the substrate;
forming a first electrode between the metallization layer and the via layer, wherein the first electrode is electrically connected to the metallization layer;
forming a second electrode between the metallization layer and the via layer, wherein the second electrode is electrically connected to the via layer; and
forming a dielectric layer between the first electrode and the second electrode, wherein the first electrode, the dielectric layer, and the second electrode form a metal-insulator-metal (MIM) capacitor;
wherein the first electrode is not electrically connected to any other conductors other than through the metallization layer, and wherein a peripheral boundary of the first electrode encompasses a peripheral boundary of the portion of the metallization layer; and
wherein the second electrode is not electrically connected to any conductors other than through the via layer.

2. The method of claim 1, wherein the first electrode and the second electrode share a common center point.

3. The method of claim 1, wherein a peripheral boundary of the first electrode encompasses a peripheral boundary of the second electrode.

4. The method of claim 1, wherein the dielectric layer and the first electrode are coextensive to a peripheral boundary of the first electrode.

5. The method of claim 1, wherein the first electrode comprises first and second bottom electrode layers.

6. The method of claim 5, wherein the first and second bottom electrode layers are coextensive to a peripheral boundary of the first electrode.

7. The method of claim 1, wherein the second electrode comprises first and second top electrode layers.

8. The method of claim 7, wherein the first and second top electrode layers are coextensive to a peripheral boundary of the second electrode.

9. A method comprising:
forming a portion of a metallization layer on a substrate;
forming a via layer on the substrate;
forming a first electrode between the metallization layer and the via layer, wherein the first electrode is electrically connected to the metallization layer;
forming a second electrode between the metallization layer and the via layer, wherein the second electrode is electrically connected to the via layer; and
forming a dielectric layer between the first electrode and the second electrode, wherein the first electrode, the dielectric layer, and the second electrode form a metal-insulator-metal (MIM) capacitor;
wherein the first electrode is not electrically connected to any other electrical components other than through the portion of the metallization layer, and wherein a peripheral boundary of the first electrode encompasses a peripheral boundary of the portion of the metallization layer; and
wherein the second electrode is not electrically connected to any other electrical components other than through the via layer.

10. The method of claim 9, wherein the first electrode and the second electrode share a common center point.

11. The method of claim 9, wherein a peripheral boundary of the first electrode encompasses a peripheral boundary of the second electrode.

12. The method of claim 9, wherein the dielectric layer and the first electrode are coextensive to a peripheral boundary of the first electrode.

13. The method of claim 9, wherein the first electrode comprises first and second bottom electrode layers.

14. The method of claim 13, wherein the first and second bottom electrode layers are coextensive to a peripheral boundary of the first electrode.

15. The method of claim 9, wherein the second electrode comprises first and second top electrode layers.

16. The method of claim 15, wherein the first and second top electrode layers are coextensive to a peripheral boundary of the second electrode.

17. A semiconductor device, comprising:
a semiconductor substrate;
a portion of a metallization layer formed on the semiconductor substrate;
a via layer formed on the semiconductor substrate;
a first electrode between the metallization layer and the via layer, wherein the first electrode is electrically connected to the metallization layer;
a second electrode between the metallization layer and the via layer, wherein the second electrode is electrically connected to the via layer; and
a dielectric layer between the first electrode and the second electrode, wherein the first electrode, the dielectric layer, and the second electrode form a metal-insulator-metal (MIM) capacitor;
wherein the first electrode comprises first and second bottom electrode layers, wherein the first and second bottom electrode layers are coextensive to a peripheral boundary of the first electrode, and wherein a peripheral boundary of the first electrode encompasses a peripheral boundary of the portion of the metallization layer; and
wherein the second electrode comprises first and second top electrode layers, wherein the first and second top electrode layers are coextensive to a peripheral boundary of the second electrode.

18. The semiconductor device of claim 17, wherein the first electrode and the second electrode share a common center point.

19. The semiconductor device of claim 17, wherein a peripheral boundary of the first electrode encompasses a peripheral boundary of the second electrode.

20. The semiconductor device of claim 17, wherein the dielectric layer and the first electrode are coextensive to a peripheral boundary of the first electrode.

* * * * *